United States Patent
Martel et al.

[11] Patent Number: 6,160,412
[45] Date of Patent: Dec. 12, 2000

[54] IMPEDANCE-MATCHED INTERCONNECTION DEVICE FOR CONNECTING A VERTICAL-PIN INTEGRATED CIRCUIT PROBING DEVICE TO INTEGRATED CIRCUIT TEST EQUIPMENT

[75] Inventors: Anthony Paul Martel, New Fairfield; Francis T. McQuade, Watertown, both of Conn.

[73] Assignee: Wentworth Laboratories, Inc., Brookfield, Conn.

[21] Appl. No.: 09/186,084

[22] Filed: Nov. 5, 1998

[51] Int. Cl.[7] .............................. G01R 31/02; G01R 31/26
[52] U.S. Cl. ........................... 324/761; 324/765; 324/754
[58] Field of Search .................................... 324/761, 753, 324/765, 754

[56] References Cited

U.S. PATENT DOCUMENTS

| | | | |
|---|---|---|---|
| 3,654,585 | 4/1972 | Wickersham | 339/17 M |
| 3,806,801 | 4/1974 | Bove | 324/72.5 |
| 3,911,361 | 10/1975 | Bove et al. | 324/158 P |
| 4,038,599 | 7/1977 | Bove et al. | 324/158 |
| 4,901,013 | 2/1990 | Benedetto et al. | 324/158 P |
| 4,975,638 | 12/1990 | Evans et al. | 324/158 P |
| 5,416,429 | 5/1995 | McQuade et al. | 324/762 |
| 5,635,846 | 6/1997 | Beaman et al. | 324/761 |

*Primary Examiner*—Safet Metjahic
*Assistant Examiner*—James C. Kerveros
*Attorney, Agent, or Firm*—William C. Crutcher

[57] ABSTRACT

An interconnection device used with test probe equipment for connecting a vertical-pin integrated circuit probing device to external test equipment. The interconnection device comprises a probe card with a pattern of contacts, a mounting plate adjustably mounted to the probe card and a space transformer member attached to both the mounting plate and the probe card. The space transformer carries traces which connect a small pattern of pins on the probing device with a larger pattern of conductors on the probe card. The space transformer is a laminated impedance-matching member comprising two layers of beryllium copper separated by a thin dielectric adhesive.

10 Claims, 6 Drawing Sheets

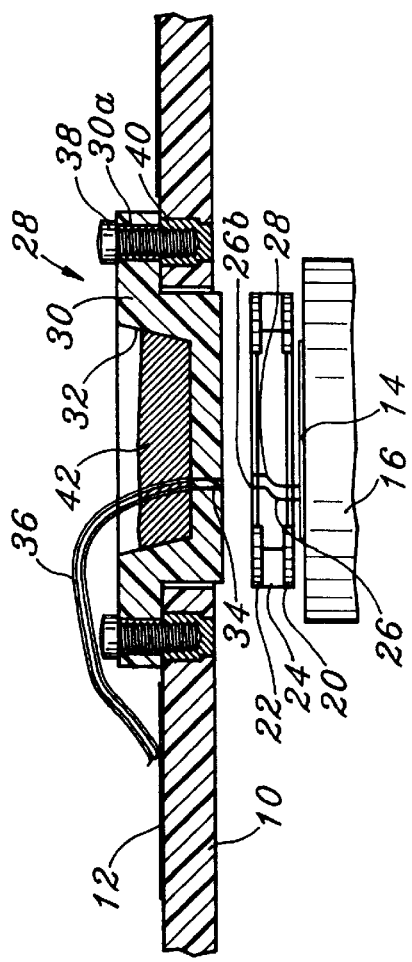
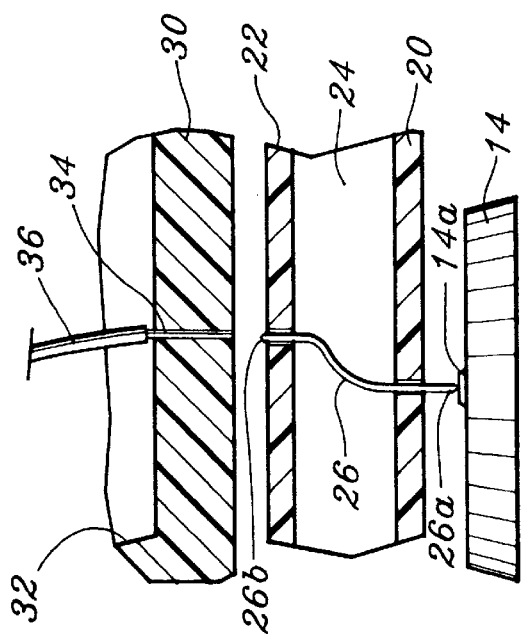
Fig. 1 Prior Art
Fig. 2 Prior Art

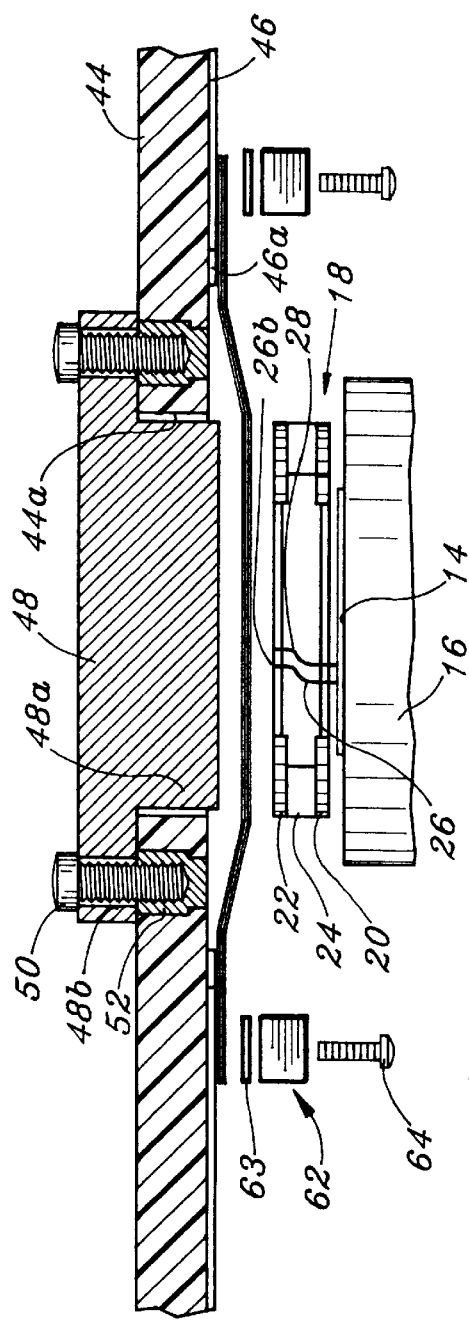
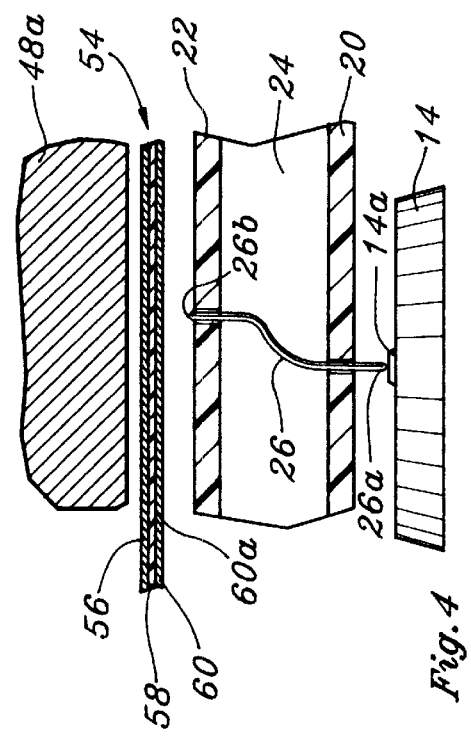
Fig. 3
Fig. 4

IMPEDANCE-MATCHED INTERCONNECTION DEVICE FOR CONNECTING A VERTICAL-PIN INTEGRATED CIRCUIT PROBING DEVICE TO INTEGRATED CIRCUIT TEST EQUIPMENT

This invention relates generally to test probe equipment for integrated circuits, and more particularly to an improved interconnection device for connecting a vertical-pin integrated circuit probing device to integrated circuit test equipment.

BACKGROUND OF THE INVENTION

Integrated circuits are tested by probing their contact pads and observing the results on special test equipment electrically connected to the probes and designed for this purpose. Various types of probes have been used, ranging from individual probes held in automated probe positioning devices, to multiple probes arranged in a pattern matching that of the integrated circuit contact pads and arranged to make temporary contact. For example, one arrangement for testing integrated circuits with multiple probes is described in U.S. Pat. No. 4,975,638 issued Dec. 4, 1990 to Evans et al., in which a contactor sheet of flexible film material has probe contacts formed on the under surface thereof in a pattern matching the contact pads on the integrated circuit device, whereby when the IC device is moved so that its contact pads engage the probe contacts, this action causes the probe contacts to scrub the contact pads to ensure effective electrical contact.

Another multiple probe assembly for testing integrated circuits is disclosed in U.S. Pat. No. 5,416,429 issued May 16, 1995 in the name of McQuade et al. and assigned to the present assignee. In this patent, a flexible laminated member held in cantilever support fashion included individual probe fingers making direct contact with the integrated circuit contact pads. The laminated member was constructed of two beryllium copper plies adhered by a dielectric adhesive comprising a modified acrylic to provide impedance matching.

As the number and density of connection pads increase on integrated circuits, special multiple probe devices have been devised for holding the probes in a predetermined pattern corresponding to the integrated circuit to be tested, and slidably supporting the probes, which are constructed as vertical pins. The test device is moved against the bottom ends of the pins while contact is maintained with the exposed upper heads of the pins. The type of probe head thus constructed was developed by IBM and is described in a number of U.S. Patents including, for example, U.S. Pat. No. 3,806,801 describing an earlier construction. This type of probe holder, which is sometimes referred to as a vertical-pin integrated circuit probing device has been improved by IBM and other manufacturers. Such a device is manufactured and sold by applicant's assignee as a COBRA® probe. A vertical pin probing device is used in conjunction with a printed circuit test board, which is connected in test circuit relationship with the external test equipment for testing the integrated circuit.

Inasmuch as the matrix or pattern of exposed heads of the vertical-pin probes is relatively small and dense, and must be connected to a larger pattern of traces (PCB traces) on the printed circuit test board, an interconnection device commonly known as a "space transformer" is generally employed. Various types of space transformers are shown in the prior art, for example in U.S. Pat. No. 4,038,599 issued Jul. 26, 1977 to Bove et al., U.S. Pat. No. 3,654,585 issued Apr. 4, 1972 to Wickersham, U.S. Pat. No. 3,911,361 issued Oct. 7, 1975 to Bove et al., and U.S. Pat. No. 4,901,013 issued Feb. 13, 1990 to Benedetto et al. A common type of prior art space transformer comprises a wired interface as depicted in FIGS. 1 and 2 of the present application. The wired interface space transformer conducts each individual lead from a contact pad on the lower surface of the space transformer to a PCB trace. The mass of individual wires are then potted in epoxy to hold them in place. Due to the method of construction, impedance matching of the connections between the PCB traces and the probe heads is not possible.

Another shortcoming of existing space transformers is the cost of manufacture, including, in the case of the wired interface type, the labor to accomplish the individual wiring. It would be desirable to provide a space transformer in which different trace patterns may be easily computerized and produced by a photo lithographic process. Also it would be desirable to have a space transformer in which the repetitive contact between the space transformer and the heads of the vertical pins does not wear out the contact pads on the space transformer, but rather transfers the majority of wear to the heads of the replaceable vertical pins.

Adjustability must be provided for the space transformer with respect to the printed circuit board in order to comply with dimensional specifications, such as how far the probe pin tips in the vertical-pin probe holder must be below the bottom plane of the printed circuit board.

Accordingly, one object of the present invention is to provide an improved interconnection device for connecting a vertical-pin integrated circuit probing device to external integrated circuit test equipment.

Another object of the invention is to provide an improved impedance-matched space transformer for connecting a vertical-pin integrated circuit probing device to a printed circuit board.

Still another object of the invention is to provide an improved space transformer of laminated construction which simplifies impedance-matching, adjustability for alignment, and improved connection to the printed circuit test board.

SUMMARY OF THE INVENTION

Briefly stated, the invention is practiced by providing an improved impedance-matched interconnection device for repetitively connecting a vertical-pin integrated circuit probing device to integrated circuit test equipment, the probing device being of the type having a plurality of conductive metal vertical-pin probes with exposed heads on the upper side of the probing device defining a small inner connection pattern. The interconnection device of the present invention comprises a printed circuit test board with an aperture and having PCB traces adapted to be connected in test circuit relationship to the integrated circuit test equipment. The PCB traces are arranged around the aperture in a large outer connection pattern. A mounting plate attached to the printed circuit test board has a pressure plate portion with a flat lower surface extending into the aperture. A laminated impedance-matched space transformer comprises a conductive ground plane layer disposed in contact with the flat surface of the pressure plate portion, a dielectric layer adhered to the ground plane layer, and a conductive trace layer adhered to the dielectric layer. The trace layer is made up of space transformer traces, selected space transformer traces having contact terminals arranged to make temporary contact with respective exposed heads of the vertical-pin probes in the small inner connection pattern. The space transformer traces have ends extending beyond the edge of the ground plane layer and are electrically connected to respective PCB traces of the large outer connection pattern.

DRAWINGS

The object of the invention will be better understood by reference to the following description, taken in connection with the accompanying drawings, in which:

FIG. 1 is a simplified horizontal elevational view in cross section of a prior art interconnection device illustrating a "wired interface" type of "space transformer", FIG. 2 is an enlarged horizontal elevation view in cross section of a portion of FIG. 1, illustrating the prior art, FIG. 3 is a simplified horizontal elevation view in cross-section of an interconnection device according to the present invention, FIG. 4 is an enlarged horizontal elevational view in cross-section of a portion of FIG. 3, FIG. 5 is an exploded perspective view of the interconnection device shown in FIG. 3, FIG. 6 is a bottom plan view of a printed circuit test board, FIG. 7 is a perspective view of the bottom side of an inverted interconnection device, FIG. 8 is the same perspective view as FIG. 7, but including the vertical-pin probing device, also inverted, and FIG. 9 is an enlarged cross section showing the interconnection between the space transformer and the printed circuit test board, also inverted.

DESCRIPTION OF THE PREFERRED EMBODIMENT

Figure 5:
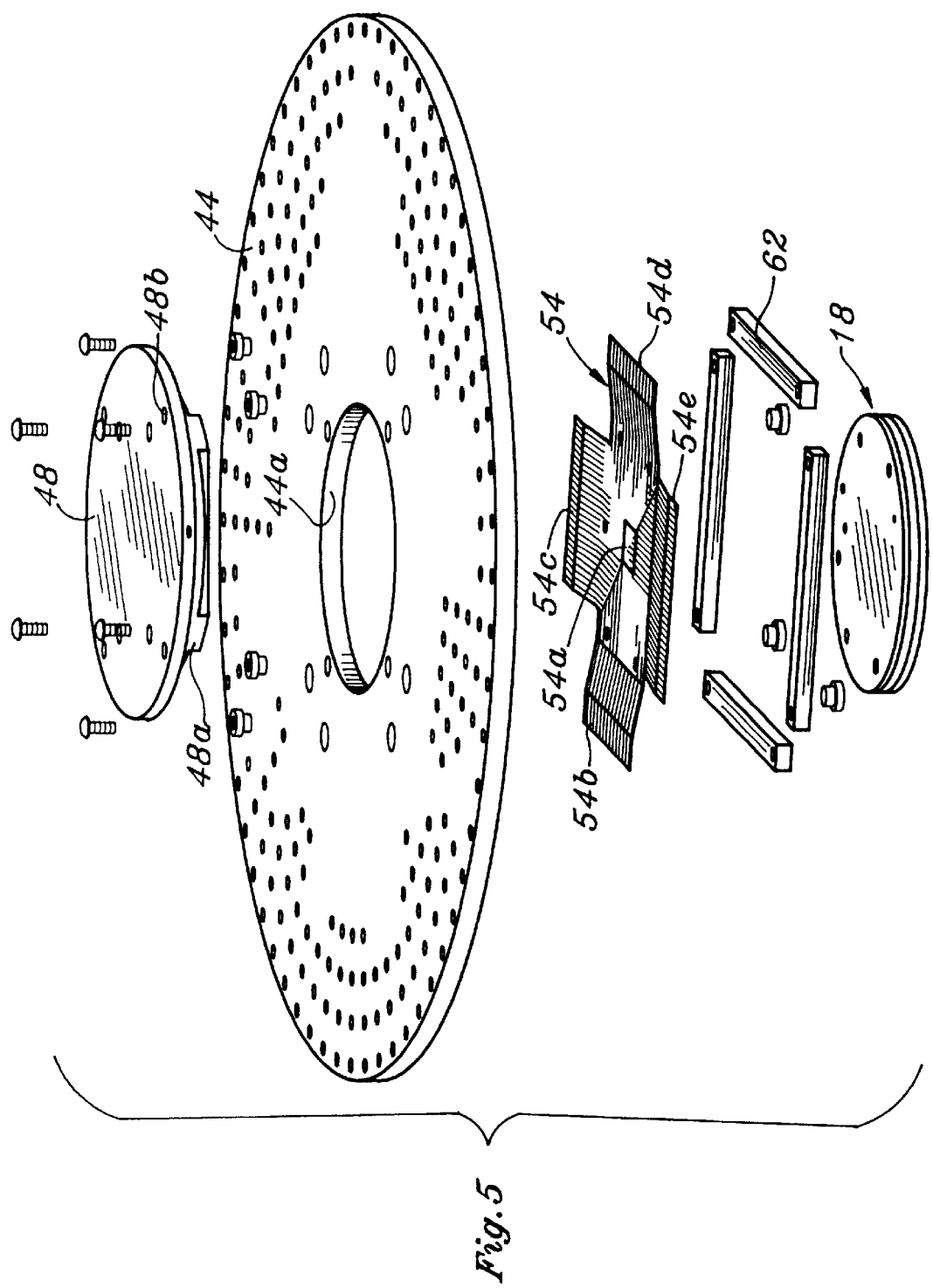

Before describing the preferred embodiment, reference should be made to FIGS. 1 and 2 of the drawing illustrating a prior art wired interface type of interconnecting device. The simplified view of FIG. 1 illustrates a prior art construction. A printed circuit test board 10 sometimes called a "probe card" includes conductive traces 12 which are connected in test circuit relationship to integrated circuit test equipment (not shown). In practice, the traces 12 lead to "pogo pads" on the printed circuit board, to which the external test equipment leads are connected in a prescribed test. An integrated circuit 14 or other device under test is supported on a chuck 16. Integrated circuit 14 typically has a pattern or matrix of contact pads to be simultaneously probed by a vertical-pin integrated circuit probing device 18, such as the COBRA® probe head sold by Wentworth Laboratories. Probing device 18 includes a lower die 20 and upper die 22 separated by a spacer 24 and carrying multiple vertical pin probes 26, 28.

Reference to the enlarged cross-section view FIG. 2 illustrates that each such probe such as 26 includes a probe tip 26a protruding from the lower face of lower die 20 and an exposed head 26b protruding from the upper side of upper die 22. The vertical probe pin is slightly bowed or offset to promote buckling so as to create substantially uniform contact pressure on the integrated circuit pads despite a slight vertical unevenness or misalignment.

The prior art space transformer shown in FIG. 1 is indicated generally at 28 and comprises a mounting block 30 with a well 32 formed therein. At the bottom of the well, a number of holes 34 are laid out to dimensionally correspond to a first small inner pattern defined by the exposed heads 26b of the probe head assembly 18. An individual insulated wire 36 is connected to PCB trace 12 at one end and the other end of the wire extends into hole 34 so as to be exposed on the underside of space transformer mounting block 30.

Space transformer mounting block 30 is attached to the PC board by means such as screws 38 extending into inserts 40 in the PCB. Slight movement of the space transformer with respect to the PCB 10 is provided for by means of enlarged holes 30a around bolts 38. This movement is permitted by the flexibility of the wires 36. A suitable epoxy potting compound indicated at 42 is used to immobilize the ends of the wires 36 inside cavity 32.

Referring now to the improvement of the present invention, see FIGS. 3 and 4 which are simplified views corresponding to the prior art version of FIGS. 1 and 2. In FIGS. 3 and 4, the same reference numerals are used to apply to the elements which are the same as previously described, namely the vertical-pin probe head assembly 18, integrated circuit 14 on chuck 16, and the printed circuit test board 44. However, note that the printed circuit board 44 has PCB traces 46 arranged on the underside thereof. The PCB traces 46 are adapted to be connected in test circuit relationship to external integrated circuit test equipment (not shown). The PCB traces 46 have terminal ends 46a arranged in a large outer connection pattern around PCB aperture 44a as will be described later.

A mounting plate 48 having a pressure plate portion 48a with a lower flat surface extending into aperture 44a is attached to PCB 44. Screws 50 extend through oversized holes 48b in mounting plate 48 and are threaded into inserts 52 secured in PCB 44 for this purpose.

Mounting plate 48 may be adjusted to move horizontally in any direction within aperture 44a or to rotate slightly. This adjustment is carried out by loosening screws 50, adjusting the mounting plate 48 slightly, and then tightening screws 50. Mounting plate 48 is arranged to cooperate with a special laminated space transformer 54 in accordance with the present invention. Space transformer 54 serves to provide an impedance-matched connection between each of the exposed heads such as 26b on the probe head assembly 18 and a corresponding end terminal such as 46a of a trace 46 on the underside of PCB 44.

Reference to the detailed cross-sectional view of FIG. 4 shows that laminated space transformer 54 is comprised of three layers—a conductive ground plane layer 56, a dielectric layer 58 adhered thereto, and a conductive space transformer layer 60. The ground plane layer 56 is arranged to be in contact with and attached to the flat surface of the pressure plate portion 48a of the mounting plate. The mounting plate is of anodized aluminum and therefore is insulated from the ground plane layer 56 by the anodizing layer. The trace layer is made up of individual space transformer traces, each of which is adapted to serve as an electrical connection between an exposed head 26b of a probe and a PCB trace 46. The laminated assembly making up space transformer 54 is manufactured by adhering together two sheets of beryllium copper each about 0.001 inches (0.025 mm) thick, using a very thin layer of modified acrylic as the adhering dielectric. The dielectric layer is only on the order of 0.001 inches (0.025 mm) in thickness.

The individual space transformer traces are produced by the photo lithographic process by photographically producing a preselected pattern of traces and then etching to remove the material between traces, the remaining structure being supported by the thin dielectric film where the trace layer extends beyond the ground plane layer. At these points, the insulating dielectric material is subsequently removed by laser, so that electrical contact can be made with traces 46 on the PCB 44. As seen in FIG. 3, one method of making electrical contact is by means of a pressure pad and clamp assembly 62, attached to PCB 44 by screws 64.

Referring to FIG. 5, the exploded view shows the arrangement of the aforementioned elements depicted in cross section in FIG. 3. The laminated space transformer 54 includes a rectangular center portion 54a and four wings 54b, 54c, 54d, 54e, each angled upwardly therefrom and then angled back into a plane parallel to the plane containing central section 54a. The wings 54b–54e coupled with the adjustable movement provided by oversized holes 48b in the mounting plate permit adjusting movements for the purpose of aligning with the connection terminals on the underside of the PCB.

Figure 6:
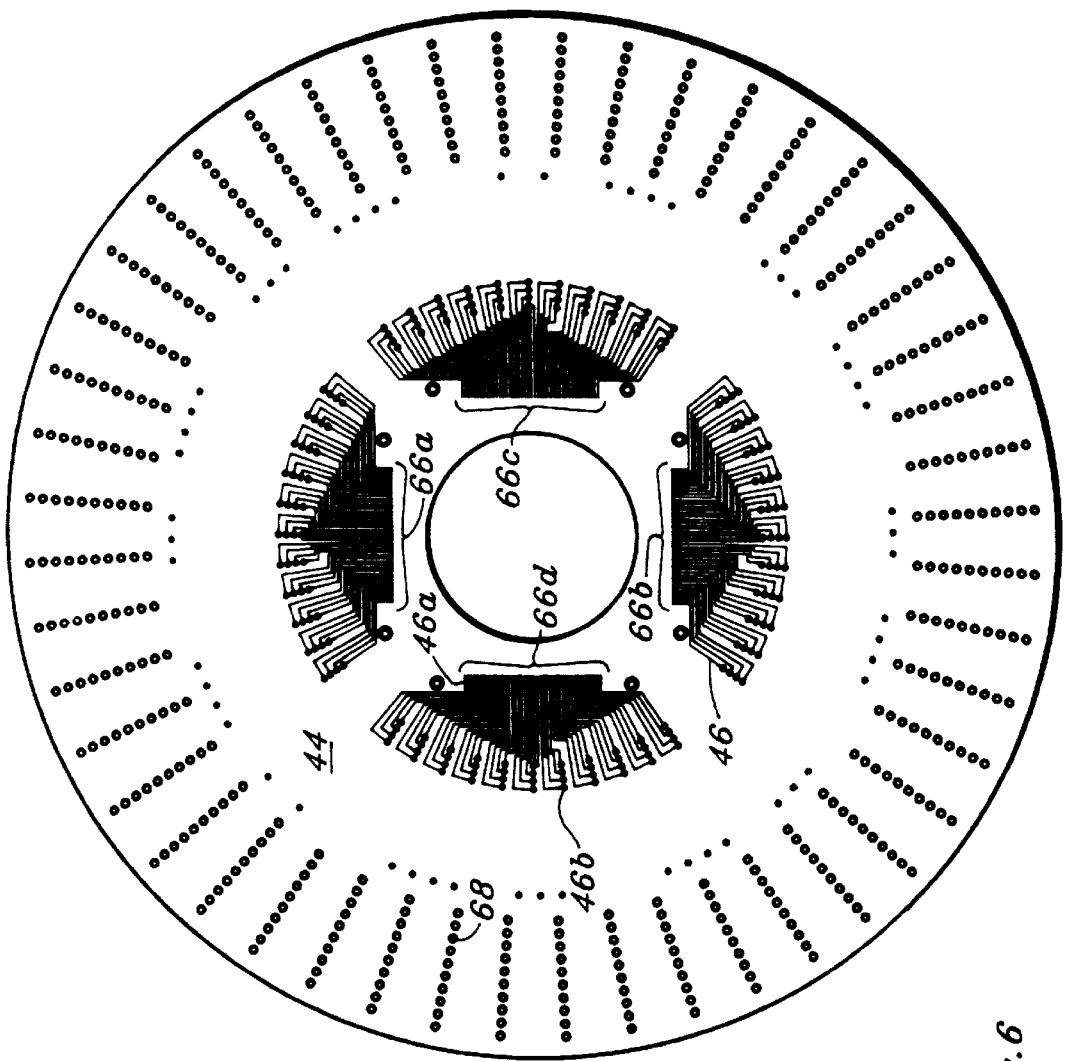

Referring to FIG. 6 of the drawing, the underside of the PCB is illustrated with the conductive traces 46 shown, as exemplified by one of the conductive traces 46 with a terminal end 46a. The terminal ends of the traces are arranged around the aperture 44a in a large outer connection pattern made up of four linear arrays 66a, 66b, 66c, 66d. Each trace 46 is typically connected by a via to a pogo pad connection 68, which in turn is connected to test equipment by means well known in the art.

Figure 7:
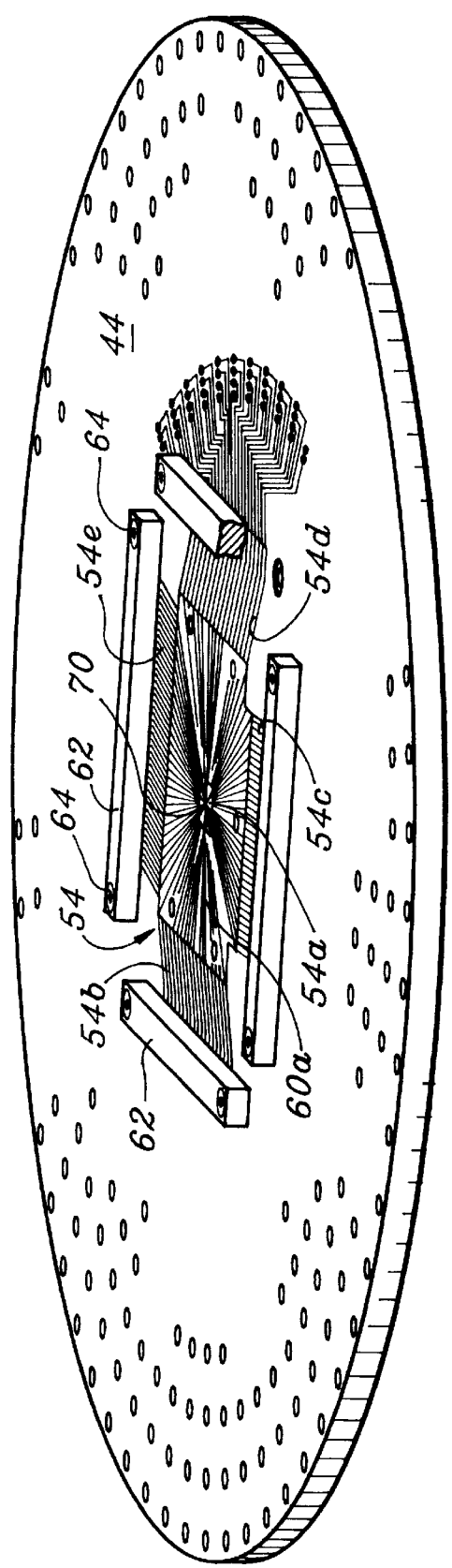

Referring to FIG. 7 of the drawing, the underside of PCB 44 is illustrated without showing the PCB traces in full, but showing the arrangement of the laminated space transformer 54. The free ends of each of wings 54b–54e are secured and the ends of the space transformer traces are electrically connected to respective PCB traces by clamps 62 held in place by screws 64. Pressure pads 63 (see FIG. 9) may also be included. A portion of one of the clamps 62 is broken away to illustrate how the ends of the space transformer traces are aligned with the ends of the PCB traces. In order to adjust this alignment, the mounting plate may be adjusted in a horizontal plane or rotated slightly by means of the oversize mounting holes and mounting screws 50 as previously described. The space transformer traces such as 60a terminate at their inward ends in a second small interconnection pattern designated by reference numeral 70. This pattern corresponds identically to the first pattern of exposed heads 26b on the probe head assembly 18, and is located in the center portion 54a of the space transformer.

Figure 8:
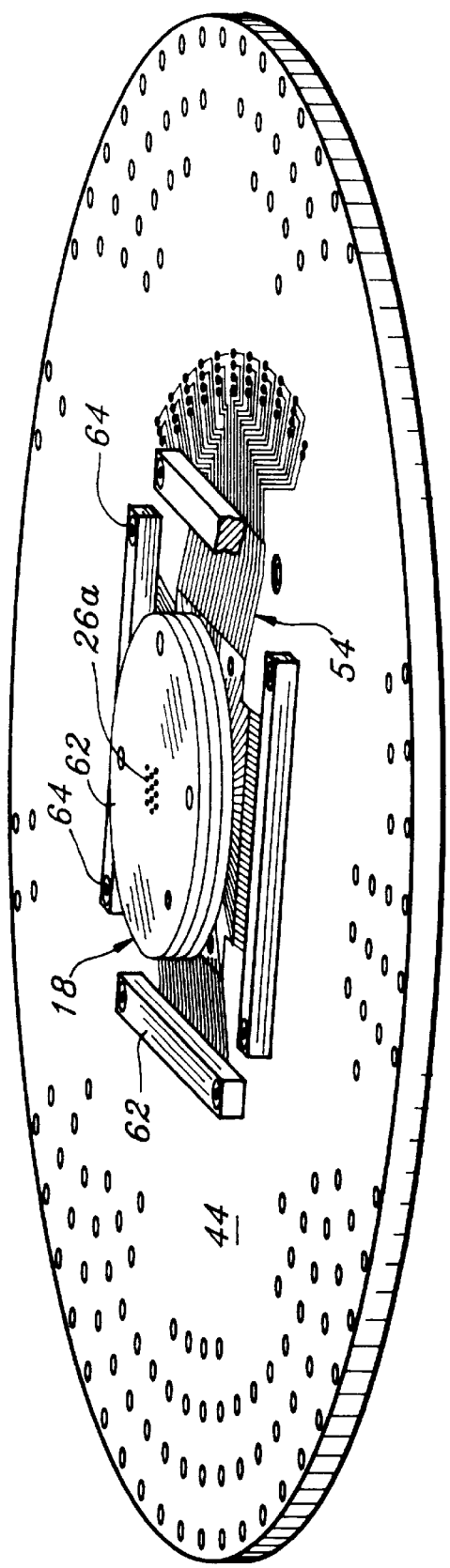

Referring to FIG. 8 of the drawing, the probe head assembly 18 is shown in place over the laminated space transformer 54 and is attached to the mounting plate (not shown) so that the small interconnection pattern on the space transformer 54 is aligned with the exposed heads on the underside of probe head assembly 18. In FIG. 8, the underside of the probe head assembly is shown with the probe tips 26a exposed.

Figure 9:
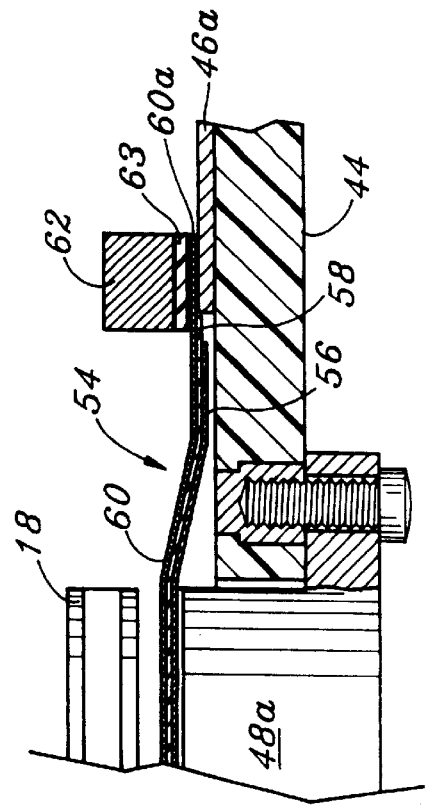

Referring to FIG. 9, an enlarged schematic cross section is seen, again inverted as in FIGS. 6, 7 and 8. A typical trace 60a in the trace layer 60 and the supporting dielectric layer 58 extend beyond the periphery of ground plane layer 56. The dielectric layer stabilizes and supports the individual traces 60a. After a laser process removes a portion of the dielectric 58, the individual space transformer traces 60a may be electrically connected to the respective PCB traces 46a as shown. The clamps 62 have pressure pads 63 underneath which correct for any vertical misalignment. Either the clamps and pressure pad assembly 62, 63 may be employed or the traces may be permanently connected by soldering.

The impedance matching characteristics of the space transformer are determined by the trace width in relation to the dielectric thickness. Because the dielectric layer is unconventionally thin, a very narrow trace may be etched 0.0015 to 0.0020 inches (0.0375 to 0.050 mm), and still achieve a 50 ohm impedance.

Another important feature is the shape of the space transformer with wings angled upwardly and then angled back into the same plane. This allows adjustment of the space transformer central section with respect to the PCB.

While there has been described what is considered to be the preferred embodiment of the invention, other modifications will occur to those skilled in the art, and it is desired to secure in the appended claims all such modifications as fall within the true spirit and scope of the invention.

What is claimed is:

1. An improved impedance-matched interconnection device for repetitively connecting a vertical-pin integrated circuit probing device to integrated circuit test equipment, said probing device being of the type having a plurality of conductive metal vertical-pin probes with exposed heads on the upper side of the probing device defining a first small inner connection pattern, the interconnection device comprising:

a printed circuit test board defining an aperture and having a plurality of PCB traces adapted to be connected in test circuit relationship to the integrated circuit test equipment, said PCB traces being arranged around the aperture to define a large outer connection pattern, a mounting plate attached to the printed circuit test board and having a pressure plate portion with a flat lower surface extending into the aperture, and a laminated impedance-matched space transformer comprising a conductive ground plane layer disposed in contact with said flat surface of the pressure plate portion, a dielectric layer adhered to said ground plane layer, and a conductive trace layer adhered to the dielectric layer, said trace layer comprising a plurality of space transformer traces, selected space transformer traces having contact terminals arranged in a second small inner connection pattern adapted to make temporary contact on one side of said traces with respective exposed heads of the vertical-pin probes in said first small inner connection pattern and having respective ends extending beyond the edge of the ground plane layer and electrically connected on the other side of said traces to respective PCB traces of said large outer connection pattern.

2. The combination according to claim 1, wherein said space transformer traces have widths selected with respect to the thickness of the dielectric film so as to provide a preselected impedance match.

3. The combination according to claim 1, wherein the space transformer traces are beryllium copper.

4. The combination according to claim 1, wherein the space transformer traces are of metal of greater hardness and wear resistance than the exposed heads of the vertical-pin probes.

5. The combination according to claim 1, wherein the space transformer traces and the ground plane layer are of berylium copper, and where the dielectric layer is of modified acrylic having a thickness on the order of 0.001 inches.

6. The combination according to claim 1, wherein the contact surfaces of the space transformer traces are disposed in a first plane and the respective ends of said traces are offset and disposed in a second plane parallel to the first plane.

7. The combination according to claim 6, wherein the mounting plate is attached to permit adjustment so as to move the mounting plate with respect to the printed circuit test board.

8. The combination according to claim 6, wherein the space transformer includes a center portion having said second small inner connection pattern disposed thereon, and a plurality of wings extending from the center portion and having said space transformer traces extending there beyond.

9. The combination according to claim 8, wherein said wings are angled into a plane parallel to and spaced from a plane containing said center portion.

10. The combination according to claim 1, and further including contact pressure pads pressing the space transformer trace extending ends into electrical contact with respective PCB traces.

* * * * *